United States Patent [19]

Yasui

[11] Patent Number: 4,617,585
[45] Date of Patent: Oct. 14, 1986

[54] PLASTIC ENCLOSING DEVICE

[75] Inventor: Mitsuru Yasui, Yokohama, Japan

[73] Assignee: Tokyo Shibaura Denki Kabushiki Kaisha, Kawasaki, Japan

[21] Appl. No.: 814,171

[22] Filed: Dec. 24, 1985

Related U.S. Application Data

[63] Continuation of Ser. No. 499,785, May 31, 1983, abandoned.

[30] Foreign Application Priority Data

May 31, 1982 [JP] Japan .................. 57-91174

[51] Int. Cl.$^4$ .................. H01L 23/12; H01L 23/30; H01L 23/34; H01L 23/12
[52] U.S. Cl. ..................... 357/72; 357/70; 357/74; 357/68
[58] Field of Search .............. 357/70, 72, 74, 68

[56] References Cited

U.S. PATENT DOCUMENTS

| 3,236,936 | 2/1966 | Robinson | 357/72 |
| 3,390,226 | 6/1968 | Beryerlein | 357/72 |
| 3,581,387 | 6/1971 | Buck et al. | 357/70 |
| 3,606,673 | 9/1971 | Overman | 357/70 |
| 4,507,675 | 3/1985 | Fujii et al. | 357/72 |

FOREIGN PATENT DOCUMENTS 0002280 1/1977 Japan .................. 357/72

Primary Examiner—Andrew J. James
Assistant Examiner—S. V. Clark
Attorney, Agent, or Firm—Oblon, Fisher, Spivak, McClelland & Maier

[57] ABSTRACT

A plastic enclosing device has a circuit element enclosed in a plastic. The element is connected with a plurality of external leads which are close to each other and a high voltage is provided to the device. They are enclosed with a plastic enclosure having a notch or step between the leads in order to increase a surface distance therebetween.

8 Claims, 20 Drawing Figures

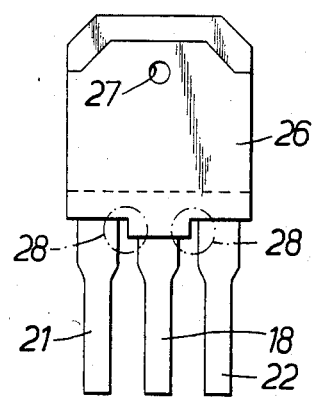 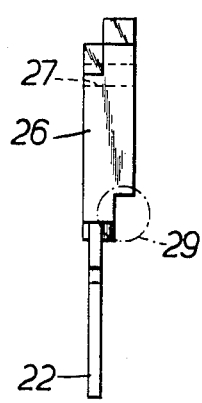
FIG.4(A).  FIG.4(B).
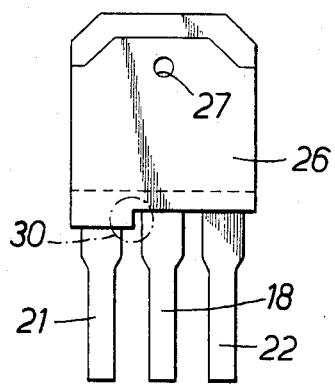 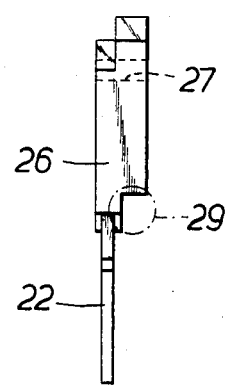
FIG.5(A).  FIG.5(B).
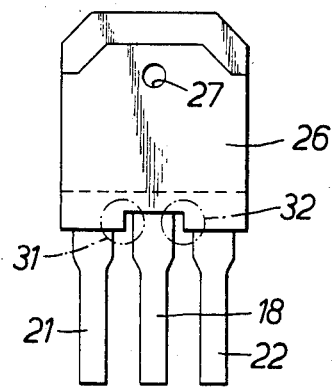 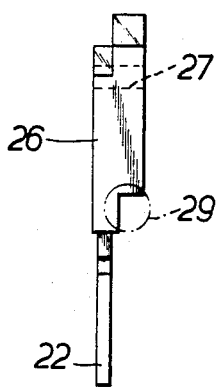
FIG.6(A).  FIG.6(B).

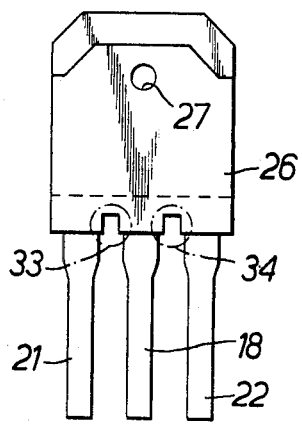
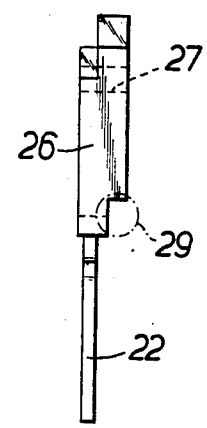
FIG.7(A). FIG.7(B).
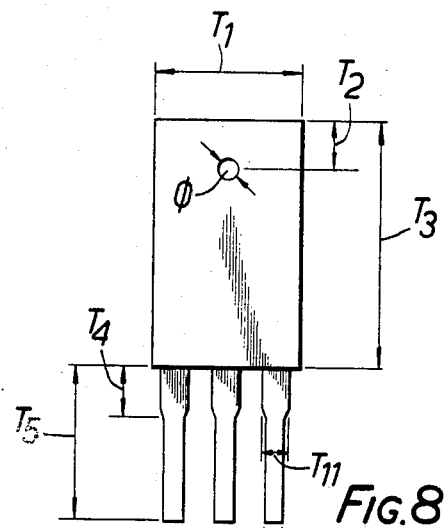
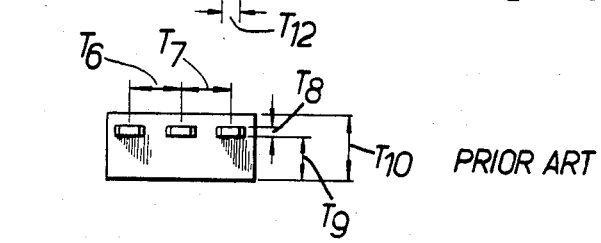
FIG.8(A). FIG.8(B).
PRIOR ART
FIG.8(C).

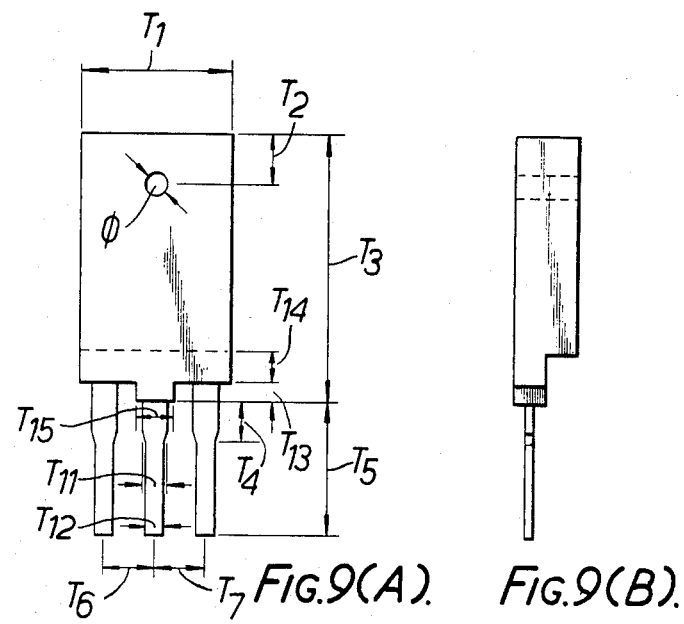
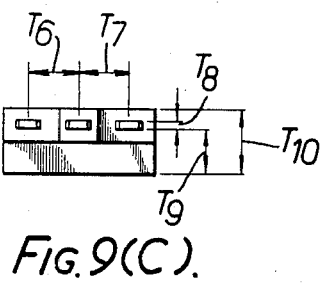
FIG.9(A).   FIG.9(B).
FIG.9(C).

PLASTIC ENCLOSING DEVICE

This application is a continuaton of application Ser. No. 499,785, filed May 31, 1983, now abandoned.

BACKGROUND OF THE INVENTION

1. Field of the Invention

This invention relates to a device enclosed within plastic resin. Plastic enclosing is widely used for various semiconductor devices including high voltage devices because they can be enclosed by a simple manufacturing process and such enclosure is suitable for automatic assembling.

2. Description of the Prior Art

A prior device is shown in FIG. 1. A transitor chip 1 is mounted on a first lead 2. The transistor has a breakdown voltage of about 1500V, and high voltage is applied thereto. The first lead 2 includes a mounting portion 3 on which a semiconductor chip is mounted and an external lead portion 4. The transistor chip 1 is bonded on the mounting portion 3 and the collector thereof is electrically connected with the mounting portion 3. The base of the transistor 1 is connected with a second lead 5 through a wire 6 and the emitter of the transistor 1 is connected with a third lead 7 through a wire 8. The end portion of the leads 2, 5 and 7, as well as the chip 1, are enclosed in a plastic enclosure 9, but a back surface of the mounting portion 3 is exposed and a hole 10 is made in the plastic enclosure 9. The hole 10 is used for fixing to an external heat radiation plate with a screw.

The practical application of the device in FIG. 1 is shown in FIG. 2. The device 11 is installed in a printed circuit board 12 and an external heat radiation plate 13. The leads 2, 5 and 7 are secured to the printed board 12 with solder 14 and the body of the device 11 is secured to the external heat radiation plate 13 with a screw 15.

In this application, if high voltage is applied to the device 11 in an atmosphere with moisture, a current leakage passage is apt to be formed between the leads 2 and 5 or the leads 2 and 7, and a current leakage passage may be formed between the leads 2, 5 and 7 and the external heat radiation plate 13. This is ture because the leads are closely arranged and the plastic enclosure 9 between them is flat and has a short surface distance, as is true for the relationship between the leads and the external heat radiation plate. Generally, the higher the applied voltage, the more the current leak is increased jointly with the moisture. When the current leakage passage between the leads is formed, the plastic enclosure 9 is heated by the current leak and the plastic may be carbonized. Carbonized plastic is conductive, so the current leak is further increased. Occasionally, smoke may be emitted and the plastic begins to burn. This may destroy the device.

Moreover, some devices are used in desert conditions. As such, the devices will be subjected to humidity of more than 100% because of the difference of temperatures between the daytime and the night. Also, salt may be included in the moisture. So, the current leakage passage will be more apt to be formed because water including salt is more conductive than pure water.

SUMMARY OF THE INVENTION

It is accordingly an object of this invention to provide a plastic enclosing device having high reliability for use with a high voltage.

Another object of this invention is to provide a plastic enclosing device in which a current leakage passage between the external leads is not easily formed.

Another object of this invention is to provide a plastic enclosing device in which the surface distance of the plastic enclosure between the external leads is long.

Another object of this invention is to provide a plastic enclosing device in which moisture is not easily retained on the surface of the plastic enclosure.

Another object of this invention is to provide a plastic enclosing device comprising an element used as a circuit element and having a plurality of terminals, a plurality of leads connected with the terminals of the element, and a plastic enclosure enclosing the element and a part of the leads in which the leads are arranged close to one another and the surface of the plastic enclosure has a step or notch between the leads.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views, and wherein:

FIGS. 4A to 7A and FIGS. 4B to 7B respectively show front views and side views of other embodiments according to the invention;

FIGS. 8A, 8B and 8C respectively show a front view, a side view and a plan view of a prior device used for an experiment on reliability; and FIGS. 9A, 9B and 9C respectively show a front view, a side view and a plan view of an embodiment according to this invention used for an experiment on reliability.

DETAILED DESCRIPTION OF THE PREFERRED EMBODIMENT

Figures 3A, 3B:
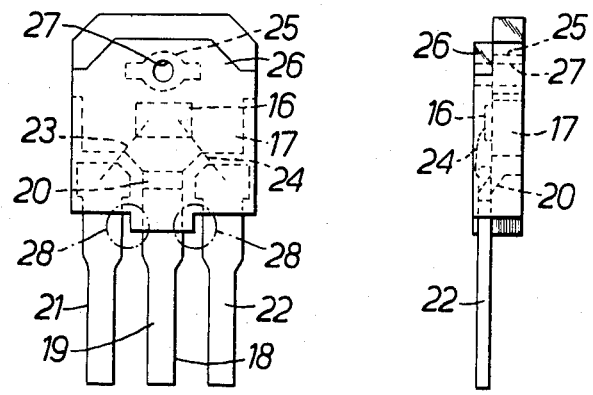
FIG. 3A and FIG. 3B respectively show a front view and a side view of a device according to this invention.

Referring now to the drawings, wherein like reference numerals designate identical or corresponding parts throughout the several views, and more particularly to FIG. 3 thereof, one embodiment of a device of this invention is illustrated.

FIG. 3 shows a preferred embodiment of this invention. A transistor chip 16 is mounted on a mounting portion 17 of a first lead 18. The transistor 16 has the breakdown voltage of about 1500V, and a high voltage is provided to it. The mounting portion 17 has a wide area and operates also as a heat radiation plate. An external lead portion 19 and a connecting portion 20 which connects the mounting portion 17 with the external lead portion 19, and includes a step portion, also form a part of the first lead 18. The mounting portion 17 is positioned on a different level than is the external lead portion 19 and a hole 25 is formed therein. The hole 25 can be used for installing the device on an external heat radiation plate. The collector of the transistor 16 is bonded to the mounting portion 17 and is electrically connected with the lead 18. The base and emitter of the transistor are, respectively, connected with a second lead 21 and a third lead 22 through Au wires 23 and 24. The Au wires 23 and 24 easily provide such connection without contact with the first lead 18 because the second and third leads 21 and 22 are positioned on different levels from the mounting portion 17 of the first lead 18.

During fabrication, the transistor chip 16 and a part of each lead 18, 21 and 22 are enclosed with resin in a mold, and the plastic enclosure 26 is formed. Then, the back side of the mounting portion 17 is exposed in order to increase the efficiency of heat radiation. A hole 27 is then formed in the plastic enclosure 26 at a position coaxial with the hole 25. The plastic enclosure 26 has a configuration different from the prior device. Namely, a protruding part is formed by step portions 28 between the leads 18 and 21 and between the leads 18 and 22. The steps 28 can be easily formed by changing the shape of the mold. The steps 28 increase the surface distance of the plastic enclosure 26 between the leads 18 and 21 and the leads 18 and 22. Therefore, the current leakage passage between each lead is not readily formed even if moisture is adhered to the surface of the plastic enclosure 26. Generally, moisture will be concentrated in the gaps formed by the steps 28 between the plastic enclosure 26 and the lead 21 or 22, and will not easily be adhered around the lead 18 due to the existence of the protruding part of the enclosure at the lead 18.

Another embodiment is shown in FIG. 4. The semiconductor device in this embodiment has the same structure as the first embodiment, but its plastic enclosure 26 has a different configuration. In particular, a step portion 29 is formed on the back of the plastic enclosure 26. A notch is defined by this step and by an external radiation plate when this device is installed on the external heat radiation plate, as explained in FIG. 2. In this case, the step portion 29 defines a longer surface distance between the leads 21 and 22 and the external heat radiation plate. Therefore, even if a high voltage is applied between the leads 21 and 22 and the external heat radiation plate, which usually has the same voltage as the collector of the transistor 16, a current leakage passage is not easily formed because the surface distance of the plastic enclosure 26 therebetween is longer and the moisture will concentrate in the notch defined at 29.

FIG. 5 shows another embodiment. In this embodiment, step portions 30 and 29 are formed between only leads 18 and 21 and on the back of a plastic enclosure 26. In the case of a high voltage transistor, the voltage between the collector and base is much higher than that between the collector and emitter. This means that a current leakage passage is apt to be formed between the leads 18 and 21 which are, respectively, connected with the collector and base of the transistor 16. Therefore, the step portion 30 is formed only between the leads 18 and 21, and is not formed between the leads 18 and 22.

FIG. 6 shows another embodiment. In this embodiment, step portions 29, 31 and 32 are formed between leads 18, 21 and 22 and on the back of the plastic enclosure 26 in a manner similar to the embodiment of FIG. 4. But the shape of the step portions 31 and 32 is opposite to that of FIG. 4. The plastic enclosure 26 around the lead 18 is hollow and forms a notch at 31 and 32. But, its function and advantage will be the same as that of FIG. 4.

FIG. 7 shows another embodiment. In this embodiment, grooves 33 and 34, each including two step portions, are formed between leads 18, 21 and 22 instead of a single notch. The grooves 33 and 34 increase the surface distance of the plastic enclosure 26 between the leads 18, 21 and 22, and moisture concentrates therein. Therefore a current leakage passage between the leads 18, 21 and 22 is much harder to be formed, compared with other embodiments and the face of the plastic enclosure 26 for each of the leads 21 and 22 and the external portion 19 of the lead 18 is in the same plane. The width of the grooves 33 and 34 must be formed narrowly, so such a mold will have to be prepared.

Figures 1A, 1B:
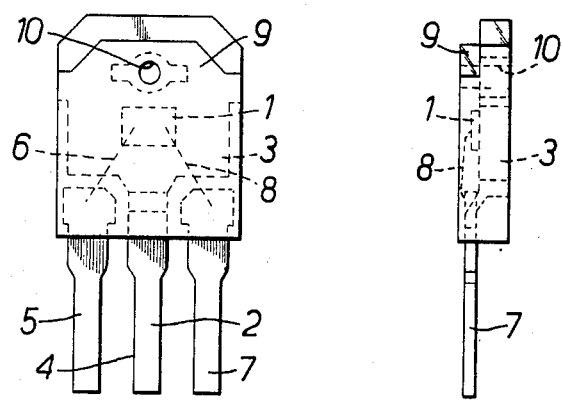
FIG. 1A and FIG. 1B respectively show a front view and a side view of a prior device.
Figures 2A, 2B:
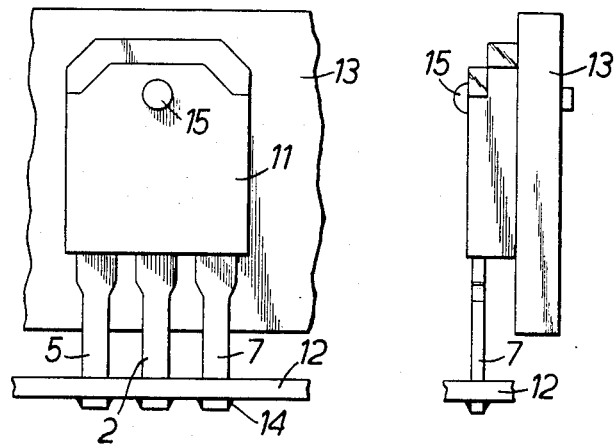
FIG. 2A and FIG. 2B respectively show a front view and a side view in which a prior device is installed on a printed board.

Next, a comparison between a device of this invention and a prior art device is explained with respect to an experiment on reliability. FIG. 8 shows a prior device used in this experiment, and FIG. 9 shows a device according to this invention. The transistor used in these devices has the breakdown voltage of 1500V. The size of each portion of these devices is shown in Table 1. These devices are installed as shown in FIG. 2. First the fixed voltage of 1500V is applied between the leads of base and collector of the transistor and they are arranged near the ventilation gate of a humidifier so that the humidity is about 100%. Moreover, more small drops of water are blown against these devices. In this state, the time at which the current leak between the leads becomes more than 5 mA is measured. As a result, it was found that the time necessary for this degree of leakage to occur in the device according to this invention is longer than that in the prior device, as shown in Table 2.

Next, a pulse voltage having a peak voltage of 1100V and a cycle of 63.5 micro seconds is applied to the same devices in the same environment and the time at which the two leads are short-circuited is measured. As the result, it was found that the time necessary for this to occur in the device according to this invention is longer than that in a prior device as shown in Table 3.

As shown in these results, the device according to this invention has a reliability of three times to six times that of the prior art for a fixed voltage and one point four times to about two times that of the prior art and pulse voltage. This invention can be used for a plastic enclosing device in which a plurality of external leads are arranged closely.

Obviously, many modifications and variations of this invention are possible in light of the above teachings. It is therefore to be understood that within the scope of the appended claims, the invention may be practiced otherwise than as specifically described herein.

TABLE 1

| | The size of the device | |
|---|---|---|
| | The device of FIG. 8 | The device of FIG. 9 |
| $T_1$ | 15.9 | 15.5 |
| $T_2$ | 4.5 | 4.5 |
| $T_3$ | 20.0 | 25.0 |
| $T_4$ | 3.3 | 1.5 |
| $T_5$ | 13.5 | 19.0 |
| $T_6$ | 5.45 | 5.45 |
| $T_7$ | 5.45 | 5.45 |
| $T_8$ | 0.4 | 0.6 |
| $T_9$ | 2.8 | 2.8 |
| $T_{10}$ | 4.8 | 5.0 |
| $T_{11}$ | 2.0 | 2.0 |
| $T_{12}$ | 1.0 | 1.0 |
| $T_{13}$ | | 2.0 |
| $T_{14}$ | | 2.0 |
| $T_{15}$ | | 2.0 |
| $\phi$ | 3.2 | 3.6 |

TABLE 2

| Test Device | Time |
| --- | --- |
| The prior device | 3 minutes and 49 seconds to 4 minutes and 5 seconds |
| The device according to this invention | 14 minutes and 20 seconds to 19 minutes and 20 seconds. |

TABLE 3

| | |
| --- | --- |
| The prior device | 16 minutes and 50 seconds to 24 minutes and 32 seconds |
| The device according to this invention | More than 30 minutes. |

What is claimed as new and desired to be secured by Letters Patent of the United States is:

1. A plastic enclosing device installed on an external plate comprising:
    an element usable as a circuit element and having a plurality of terminals;
    a plurality of leads connected with said terminals of said element; and
    a plastic enclosure enclosing the element and a part of said leads, and having at least one main surface which is contacted with the external plate, and at least one side surface from which the leads extend outwardly, wherein a first step portion of said enclosure is formed at an intersection of the at least one main surface and the at least one side surface at a position between said plurality of leads and said external plate in order to increase a surface distance therebetween, and a second step portion of said enclosure is formed on the at least one side surface at a position between the leads.

2. A plastic enclosing device according to claim 1, wherein the element is a transistor and the leads are respectively connected with the emitter, base and collector of the transistor.

3. A plastic enclosing device according to claim 2, wherein the second step portion is formed between the leads connected with the base and collector of the transistor.

4. A plastic enclosing device according to claim 1, wherein the second step portion is a groove.

5. A plastic enclosing device according to claim 1, wherein one of the leads is exposed on the one main surface.

6. A plastic enclosing device according to claim 1, wherein a hole is formed in the plastic enclosure in order to install the device to the external plate.

7. A plastic enclosing device according to claim 1, wherein the external plate is a heat radiation plate.

8. A plastic enclosing device according to claim 1, wherein said first and second step portions are notches.

* * * * *